United States Patent [19]

Gigante et al.

[11] Patent Number: 4,532,702

[45] Date of Patent: Aug. 6, 1985

[54] METHOD OF FORMING CONDUCTIVE INTERCONNECTION BETWEEN VERTICALLY SPACED LEVELS IN VLSI DEVICES

[75] Inventors: Joseph R. Gigante, Beltsville; Rathindra N. Ghoshtagore, Columbia, both of Md.

[73] Assignee: Westinghouse Electric Corp., Pittsburgh, Pa.

[21] Appl. No.: 549,125

[22] Filed: Nov. 4, 1983

[51] Int. Cl.$^3$ .......................................... H01L 21/285
[52] U.S. Cl. ...................................... 29/578; 29/589; 29/590; 29/591; 148/174; 427/91; 427/343
[58] Field of Search ................ 29/578, 589, 590, 591; 148/174; 427/91, 343

[56] References Cited

U.S. PATENT DOCUMENTS

| | | | |
|---|---|---|---|
| 4,343,676 | 8/1982 | Tarng | 29/591 X |
| 4,392,298 | 7/1983 | Barker et al. | 29/578 X |
| 4,458,410 | 7/1984 | Sugaki et al. | 29/591 |

OTHER PUBLICATIONS

Miller et al., *Solid State Technology,* Dec. 1980, pp. 79–82.

*Primary Examiner*—George T. Ozaki
*Attorney, Agent, or Firm*—Walter G. Sutcliff

[57] ABSTRACT

A method of fabrication of an electrical connection between two vertically spaced conducting layers in an integrated circuit structure. The first conducting layer is a selected area of the semiconductive substrate which is otherwise covered with a dielectric layer. The exposed selected area of the semiconductive substrate is treated with an activation agent and a selected conductor is chemically vapor deposited upon the activated selected area of the semiconductive substrate. The selected conductor interconnect is built up in successive chemical vapor deposition steps preceded by activation treatment of the exposed top surface until the conductor interconnect is approximately equal to the thickness of the dielectric layer and has a highly planar surface upon which can be readily deposited the second conductive layer which is thus interconnected to the semiconductor substrate.

6 Claims, 4 Drawing Figures

METHOD OF FORMING CONDUCTIVE INTERCONNECTION BETWEEN VERTICALLY SPACED LEVELS IN VLSI DEVICES

BACKGROUND OF THE INVENTION

The present invention relates to VLSI circuit fabrication and more particularly to forming conductive interconnects between vertically spaced conductive levels. In VLSI circuit fabrication, it is important to form stepless interconnects between various levels, and for the interconnect metal to have a highly planar top surface upon which the second level metal layer can be uniformly deposited and thereafter patterned by fine line photolithography.

The prior art technique for forming such interconnects has been to form a via or aperture in the dielectric layer which separates the conductive levels, and then to fill or plug the via with a conductive material. A widely used process is to form aluminum plugs in the via by a lift-off process following deposition of a thin barrier layer of titanium-tungsten within the via upon the semiconductive substrate. The barrier layer prevents the diffusion of aluminum and spiking into the semiconductive substrate, which is typically silicon. Another barrier layer material is platinum silicide, which can be covered with titanium-tungsten defined by a lift-off process. The fabrication of such barrier layers and interconnects which require barrier layers involves extra processing steps.

It has been known that tungsten can be selectively chemically vapor deposited (CVD) for use in VLSI circuit fabrication. Such tungsten deposits exhibit low resistivity, and such processes are described in "Hot-Wall CVD Tungsten for VLSI", by N. Miller and I. Beinglass, Solid State Technology, December 1980, pp. 79-82.

SUMMARY OF THE INVENTION

It has been discovered that low resistivity interconnects can be readily fabricated to provide conductive interconnection between a semiconductive layer which is selectively covered with an insulating dielectric layer and a later deposited conductive layer atop the interconnect and the dielectric. This is carried out by selective activation and deposition of tungsten in vias formed in silicon dioxide atop a silicon substrate. Multiple selective deposition of the tungsten is carried out by chemical vapor deposition with a cleaning and activation step between each deposition step. In this way a thick plug of tungsten having a highly planarized top surface can be formed. The tungsten serves as an effective barrier to prevent diffusion of undesired conductor into the silicon substrate upon which the tungsten is deposited.

DESCRIPTION OF THE PREFERRED EMBODIMENT

The process of the present invention can be best understood by reference to the drawings FIGS. 1-4, which illustrate practicing the process.

Figure 1:
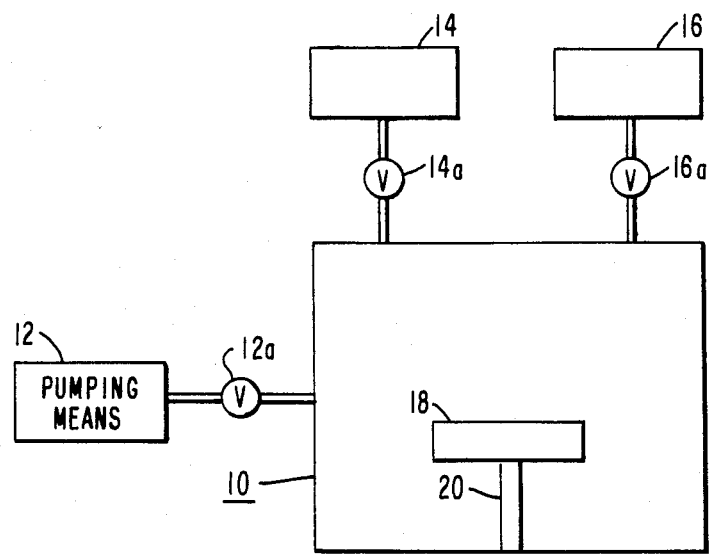
FIG. 1 is a schematic representation of a hot wall reaction chamber utilized in carrying out the process of the present invention.

In FIG. 1, a hot wall reaction chamber 10 is schematically represented as a hermetically sealed chamber which can be highly evacuated by pumping means 12 which is connectable to the chamber 10 by valve 12a. The desired reactants are introduced into chamber 10 from reservoirs 14 and 16 with valve means 14a and 16a respectively between the reservoirs and the chamber. A semiconductive wafer 18 which has already been partially processed is disposed within the chamber 10 upon support means 20.

The reservoirs 14 and 16 contain respectively tungsten hexafluoride ($WF_6$) and hydrogen ($H_2$), which are controllably introduced into the chamber 10 for reaction and selective deposition of the tungsten.

Figure 2:
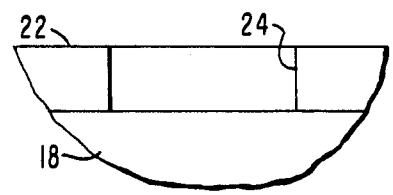
FIG. 2 is an enlarged cross-sectional view of a portion of a semiconductor wafer which is processed by the present invention.
Figure 3:
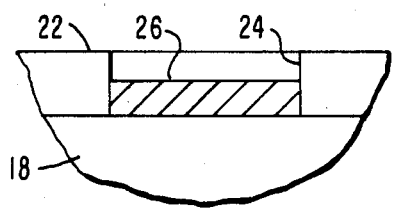
FIG. 3 is an enlarged cross-sectional view of the wafer seen in FIG. 2 after the initial deposition of tungsten in the via formed in the dielectric.
Figure 4:
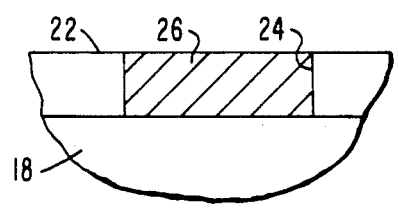
FIG. 4 is an enlarged cross-sectional view of the wafer seen in FIGS. 1 and 2 following multiple depositions of tungsten, with the built upon tungsten filling the via and presenting a highly planar surface.

The partially processed semiconductive wafer 18 is seen in greater detail in FIGS. 2-4. In FIG. 2, a sectional view of a portion of the wafer 18 is seen, which wafer may be selectively doped with conventional dopants to define source/drain regions for MOS devices over the wafer area, with a silicon dioxide dielectric layer 22 selectively grown atop the silicon wafer 18. Vias or apertures 24 in the dielectric layer 22 are photolithographically defined and formed to permit access to and interconnection with the desired silicon device regions. The silicon dioxide dielectric layer thickness is typically from 3000 to 8000 Angstroms thick, with the vias having a width or diameter of comparable dimensions of about one micron.

The silicon wafer is cleaned and activated by dipping the wafer seen in FIG. 2 in a hydrofluoric acid solution which is 50:1 of $H_2O$:HF, following by a water rinse. This activates the silicon surface which is exposed through the via to permit selected deposition thereon of the tungsten. This treatment also passivates the silicon dioxide surface from nucleation and growth of the tungsten layer.

The activated wafer is then placed in the reaction chamber of FIG. 1, and the selective deposition of tungsten 26 upon the silicon is effected to a thickness of about 1500 Angstroms as seen in FIG. 3. The reaction chamber pressure is about 1400 microns, and the chamber is maintained at about 285° C. There is no deposition of tungsten on the silicon dioxide, hence the term selective deposition.

Thereafter, another cleaning and activation step is practiced with the hydrofluoric acid solution to activate the exposed surface of the already deposited tungsten and regenerate the passivation of the silicon dioxide field layer. Then successive chemical vapor deposition of tungsten is selectively carried out in increments of 1500 Angstroms or less in successive depositions to completely fill the via and provide a highly planar top surface for the tungsten plug or interconnect as seen in FIG. 4.

Thereafter, a conductive layer such as aluminum for the next level conductor in the VLSI processing can be deposited on the tungsten completing interconnection through the tungsten to the silicon devices in the wafer.

We claim:

1. Method of depositing a thick conductive metal plug and barrier in an aperture in a dielectric layer over a semiconductive layer, which thick conductive metal plug and barrier permits electrical interconnection between the semiconductive layer and a conductive layer which is thereafter disposed atop the conductive plug, which method comprises:
   (a) treating the semiconductive layer through the aperture in the dielectric layer with an activation agent;
   (b) selectively depositing the conductive metal on the activated semiconductive layer to a predetermined thickness;
   (c) treating the deposited conductive metal through the aperture in the dielectric layer with the activation agent; and
   (d) repeating the selective deposition of the conductive metal onto the activated surface and treating the deposited metal surface with activation agent, and selective deposition until the aperture is filled with conductive metal which serves as an electrical interconnection means and a barrier against conductor migration into the semiconductive layer.

2. Method of fabricating an electrical connection between two vertically spaced conducting layers in an integrated circuit structure in which a semiconductive substrate is the first conducting layer which is selectively covered with a dielectric layer upon which the second conductive layer is later deposited, which method comprises:
   (a) treating the portion of the semiconductive layer which is not covered by the selectively covering dielectric layer with an activation agent which activation agent passivates the dielectric to prevent nucleation and metal growth thereon;
   (b) selectively depositing a selected metal conductor on the activated semiconductive layer by chemical vapor deposition to a thickness of up to about 1500 Angstroms;
   (c) treating the chemically vapor deposited metal conductor with the activation agent; and
   (d) repeating the selective chemical vapor deposition of the selected metal conductor upon the activated surface until the metal conductor layer is equal in thickness to the dielectric layer so that following deposition of the second conducting layer on the dielectric layer the chemically vapor deposited metal conductor interconnects the first and second conductive layers.

3. Method of providing a conductive interconnection between a semiconductive layer selectively covered with an insulating dielectric layer, and a conductive metal layer deposited atop the dielectric layer, which conductive interconnection has a highly planar top surface, which method comprises:
   (a) treating the semiconductor layer area which is not covered with the dielectric layer with an activation agent;
   (b) selectively chemically vapor depositing a predetermined thickness of selected conductive metal on the activated semiconductive layer area;
   (c) treating the deposited selected conductive metal with the activation agent; and
   (d) repeating the selective chemical vapor deposition of predetermined thickness of selected conductive metal and activation of the exposed deposited selected conductive metal until the selected conductive metal thickness is approximately equal to the thickness of the dielectric layer to provide the conductive interconnection, so that deposition of a selected conductor upon the dielectric layer is interconnected to the semiconductive layer.

4. Method of providing a thick plug of tungsten in an aperture provided in a silicon dioxide layer atop a silicon substrate layer, which thick plug of tungsten has a generally planar top surface which permits good electrical interconnection from the silicon substrate to a later deposited conductive layer atop the plug and the silicon dioxide layer, which method comprises:
   (a) treating the exposed silicon substrate area through the aperture with an activation agent which activation agent passivates the exposed silicon dioxide area to prevent nucleation and growth of tungsten thereon;
   (b) selectively chemically vapor depositing tungsten upon the activated silicon to a thickness of up to about 1500 Angstroms; and
   (c) treating the exposed surface of the deposited tungsten with the activation agent which agent passivates the exposed silicon dioxide area, and repeating the selective chemical vapor deposition of the tungsten upon the activated tungsten surface until the accumulated tungsten thickness is about equal to the thickness of the silicon dioxide layer, so that deposition of a conductive layer upon the tungsten and silicon dioxide permits electrical interconnection through the tungsten to the silicon substrate.

5. The method set forth in claim 4, wherein the activation agent is a hydrofluoric acid solution and which treatment includes a water wash of the treated substrate.

6. The method set forth in claim 4, wherein sequential activation of the previously deposited tungsten with hydrofluoric acid, and deposition of tungsten in succeeding layers each having a thickness of about 1500 Angstroms is repeated until the top surface of deposited tungsten is planar with the top surface of the silicon dioxide layer, whereby the deposited tungsten can be thereafter interconnected with conductive material deposited upon the tungsten and silicon dioxide.

* * * * *